(12) United States Patent
Aigeldinger et al.

(10) Patent No.: US 7,608,367 B1
(45) Date of Patent: Oct. 27, 2009

(54) VITREOUS CARBON MASK SUBSTRATE FOR X-RAY LITHOGRAPHY

(75) Inventors: Georg Aigeldinger, Livermore, CA (US); Dawn M. Skala, Fremont, CA (US); Stewart K. Griffiths, Livermore, CA (US); Albert Alec Talin, Livermore, CA (US); Matthew W. Losey, Livermore, CA (US); Chu-Yeu Peter Yang, Dublin, CA (US)

(73) Assignee: Sandia Corporation, Livermore, CA (US)

( * ) Notice: Subject to any disclaimer, the term of this patent is extended or adjusted under 35 U.S.C. 154(b) by 534 days.

(21) Appl. No.: 11/192,797

(22) Filed: Jul. 28, 2005

Related U.S. Application Data (63) Continuation-in-part of application No. 11/112,927, filed on Apr. 22, 2005.

(51) Int. Cl.
  *G03F 1/00* (2006.01)
(52) U.S. Cl. .................. 430/5; 378/34; 378/35
(58) Field of Classification Search ............ 430/5; 378/34, 35
  See application file for complete search history.

(56) References Cited

U.S. PATENT DOCUMENTS

| | | | | |
|---|---|---|---|---|
| 4,328,298 A | * | 5/1982 | Nester | 430/5 |
| 4,935,320 A | * | 6/1990 | Rohde et al. | 430/14 |
| 5,190,637 A | | 3/1993 | Guckel et al. | 205/118 |
| 5,378,583 A | | 1/1995 | Guckel et al. | 430/325 |
| 5,422,921 A | * | 6/1995 | Chiba | 378/34 |
| 5,527,646 A | * | 6/1996 | Ogino et al. | 430/5 |
| 6,103,033 A | * | 8/2000 | Say et al. | 156/73.1 |
| 6,482,553 B1 | | 11/2002 | Gottert et al. | 430/5 |

OTHER PUBLICATIONS

W. Becker, W. Ehrfeld, P. Hagmann, A. Maner, D. Munchmeyer, "Fabrication of Microstructures with High Aspect Ratios and Great Structural Heights by Synchrotron Radiation Lithography, Galvanoforming and Plastic Moulding (LIGA Process)," *Microelectronic Engineering*, 1986, v.4: 35-56.

W.K. Schomburg, H.J. Baying, and P. Bley, "Ti- and Be-X-Ray Masks with Alignment Windows for the LIGA Process" *Microelectronic Engineering*, 1991, v.13: 323-326.

(Continued)

*Primary Examiner*—Mark F Huff
*Assistant Examiner*—Stewart A Fraser
(74) *Attorney, Agent, or Firm*—Timothy P. Evans (57) ABSTRACT

The present invention is directed to the use of vitreous carbon as a substrate material for providing masks for X-ray lithography. The new substrate also enables a small thickness of the mask absorber used to pattern the resist, and this enables improved mask accuracy. An alternative embodiment comprised the use of vitreous carbon as a LIGA substrate wherein the VC wafer blank is etched in a reactive ion plasma after which an X-ray resist is bonded. This surface treatment provides a surface enabling good adhesion of the X-ray photoresist and subsequent nucleation and adhesion of the electrodeposited metal for LIGA mold-making while the VC substrate practically eliminates secondary radiation effects that lead to delamination of the X-ray resist form the substrate, the loss of isolated resist features, and the formation of a resist layer adjacent to the substrate that is insoluble in the developer.

25 Claims, 7 Drawing Sheets

OTHER PUBLICATIONS

F. J. Pantenburg, J Chlebeck, A. El-Kholi, H. L. Huber, J. Mohr, H. K. Oertel, J. Schultz, "Adhesion Problems in Deep-Etch X-ray Lithography Caused by Fluorescence Radiation from the Plating Base," *Microelectronic Engineering*, 1994, v.23: 223-226.

Y. Vladimirsky, O. Vladimirsky, V. Saile, K.J. Morris, and J.M. Klopf "transfer mask for high aspect ratio micro-lithography," in *Electron-Beam, X-Ray, EUV, and Ion-Beam Submicrometer Lithographies for Manufacturing V*, J.M. Warlaumont, (Ed.) *Proceedings of SPIE,*, 1995. v.2437: 391-396.

A. Schmidt, A. Clifton, W. Ehrfeld, G. Feiertag, H. Lehr and M. Schmidt, "Investigation of the Adhesive Strength of PMMA Structures on Substrates Obtained by Deep X-Ray Lithography," *Microelectronic Engineering*, 1996, v.30: 215-218.

F. J. Pantenburg, S. Achenbach and J. Mohr, "Characterization of Defects in Very High Deep-Etch X-Ray Lithography Microstructues," *Microsystem Technologies* 1998, v.4: 89-93.

P. Coane, R. Giasoll, S. Ledger, K. Lian, Z. Ling, J. Gottert, "Fabrication of HARM structures by deep-X-ray lithography using graphite mask technology," *Microsystem Technologies*, 1998, v.3: 94-98.

Y.M. Desta, G. Aigeldinger, K.J. Zanca, P. Coane, J. Gottert, and M.C. Murphy, "Fabrication of Graphite Masks for Deep and Ultra-deep X-ray Lithography," In *Materials and Device Characterization in Micromachining III*, Y. Vladimirsky, and P.J. Coane, (Eds.), *Proceedings of SPIE,*, 2000, v.4175: 122-130.

Th. Kunz, J. Mohr, A. Ruzzu, K. D. Skrobanek and U. Wallrabe, "Adhesion of Ni Structures on $AL_2O_3$ Ceramic Substrates used for the Sacrificial Layer Technique," *Microsystem Technologies*, 2000, v.6: 121-125.

A. El-Kholi, K. Bade, J. Mohr, F. J. Pantenburg and X. M. Tang, "Alternate Resist Adhesion and Electroplating Layers for LIGA Process," *Microsystem Technologies*, 2000, v.6: 161-164.

K.E. Mayerhofer, E. Neubauer, C. Eisenmenger-Sittner, H. Hutter, "Adhesion promotion of Cu on C by Cr intermediate layers investigated by the SIMS method," *Analytical and Bioanalytical Chemistry*, 2002, v.374: 602-607.

O. V. Makarova, D. C. Mancini, N. Moldovan, R. Divan, C. M. Tang, D. G. Ryding and R. H. Lee, "Microfabrication of Freestanding Metal Structures using Graphite Substrate," *Sensors and Actuators A*, 2003, v.103: 182-186.

H.-U. Scheunemann, B. Loechel, L. Jian, D. Schondelmaier, Y.M. Desta, and J. Goettert, "Cost Effective Masks for Deep X-ray Lithography," in *Smart Sensors, Actuators and MEMS*, J.-C.Chiao, V.K. Varadan, and C. Cany, (Eds.) *Proceedings of SPIE*, , 2003. v.5116:775-781.

M. Kuhnke, Th. Lippert, E. Ortelli, G.G. Scherer, and A. Wokaun, "Microstructuring Of glassy carbon: comparison of laser machining and reactive ion etching," *Thin Solid Films*, 2004 v.453-454: 36-41.

Y. M. Desta, "Fabrication of High Aspect Ratio Vibrating Cylinder Microgyroscope Structures by Use of the LIGA Process", Dissertation, LSU, Dec. 2005, pp. 1-179.

\* cited by examiner

VITREOUS CARBON MASK SUBSTRATE FOR X-RAY LITHOGRAPHY

CROSS REFERENCE TO RELATED APPLICATIONS

This application is a Continuation-in-Part of prior co-pending U.S. patent application Ser. No. 11/112,927 originally filed 22 Apr., 2005 entitled "ALUMINUM RESIST SUBSTRATE FOR MICROFABRICATION BY X-RAY LITHOGRAPHY AND ELECTROFORMING", the entire disclosure of which is herein incorporated by reference.

STATEMENT OF GOVERNMENT SUPPORT

The United States Government has rights in this invention pursuant to Contract No. DE-AC04-94AL85000 between the United States Department of Energy and Sandia Corporation for the operation of Sandia National Laboratories.

TECHNICAL FIELD

The present invention relates to X-ray lithography mask making. In particular, the invention relates to preparing an X-ray mask using both ultraviolet (hereinafter referred to as "UV") and X-ray lithography. The invention finds utility in enabling component microfabrication using X-ray lithography by providing X-ray masks having sufficient resolution and contrast to image the fine detail necessary for lithographically replicating microparts. In particular, embodiments of this invention provide a method for making robust X-ray mask tooling for use in the fields of semiconductor and microelectromechanical systems ("MEMS") manufacture, including the "LIGA" process (from the German Lithographie, Galvonoformung und Abformung).

BACKGROUND OF THE INVENTION

Figure 1:
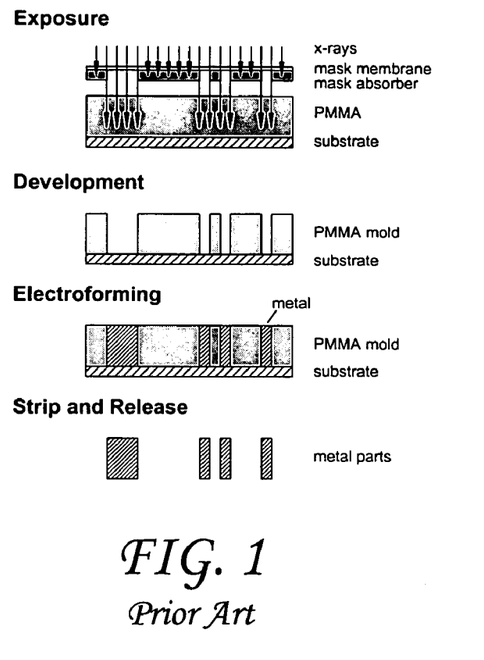
FIG. 1 shows a schematic of the LIGA process as applied to the fabrication of free-standing metal parts wherein the top surface of the mold is planarized following electrodeposition for fabrication of metal parts.

Many of the same concerns effecting fabrication of LIGA molds described in co-pending, commonly owned U.S. patent application Ser. No. 11/112,927 originally filed 22 Apr., 2005 entitled "Aluminum Resist Substrate for Microfabrication by X-ray Lithography and Electroforming" (the entire disclosure of which is herein incorporated by reference) also effect fabrication of the X-ray masks described herein. Both are generally prepared by microfabrication based on X-ray lithography wherein a thick X-ray resist, usually poly(methyl methacrylate) ("PMMA"), is bonded or cast onto a conductive substrate and exposed to X-ray radiation through a patterned mask. The resist is subsequently developed, yielding a patterned mold attached to the substrate that is later filled with a metal deposit. An abbreviated process is illustrated in FIG. 1.

Figure 2:
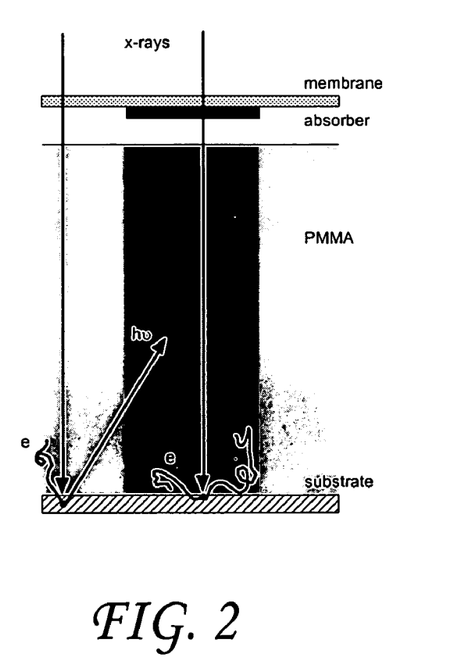
FIG. 2 shows a schematic of mask, PMMA resist and substrate, wherein X-rays absorbed in the substrate shadow region produce electrons that damage PMMA at the interface and degrade bond strength.

In particular, the substrate carrying the X-ray resist of both mold and mask provides several critical functions including holding resist features in their correct relative positions following development and throughout the plating process. Furthermore, the substrate can dramatically affect the integrity of the resist during X-ray. As illustrated in FIG. 2, primary X-rays from the synchrotron source may pass through the mask membrane and the mask absorber when the photon energy is large. These high-energy photons likely pass through the shadow-region resist, but may be absorbed in the substrate below due to the relatively high X-ray cross-sections of most substrate materials. This absorption produces high-energy photoelectrons and Auger electrons that can leave the substrate, enter the resist, and impart a large secondary radiation dose (>100 J/cm$^3$) in a thin layer of the resist directly adjacent to the substrate surface. The thickness of this layer is typically a few micrometers.

Such interface doses may lead to loss of adhesion through dissolution of the interface during development or through direct radiation-induced degradation of bond is strength. While increasing the mask absorber thickness reduces interface doses, it also degrades feature tolerances and limits producible feature sizes due to inherent limitations of the mask-making process.

X-rays absorbed in "bright" regions of the substrate (i.e., those regions which are unobstructed by an absorbing mask structure and thus "illuminated" by the X-ray source) also affect the LIGA process. Here photons pass through the mask membrane and the resist, where they are absorbed into the substrate holding the resist. Depending on the X-ray cross-section of the resist substrate this absorption can produce high-energy electrons and a high interface resist dose as is illustrated in FIG. 2. In the bright region, however, interface doses may be extremely large (~100 kJ/cm$^3$) since the mask absorber does not shade these regions and thus removes none of the primary spectrum. Such extreme doses yield a thin layer of insoluble resist adjacent to the substrate, and this insoluble layer must be removed following development via a post-development etch process that roughens the sidewalls of the resist features and is, therefore, unacceptable for some applications of the process.

X-rays absorbed in bright regions of the substrate also produce fluorescence radiation. In contrast to electrons, fluorescence photons are absorbed over large distances, and the range of this absorption may reach several millimeters. Since fluorescence is emitted isotropically, a portion of this radiation is absorbed in the region of the resist that is shaded by the absorbing structures of the mask. During subsequent development, this extraneous dose can lead to substantial dissolution of feature sidewalls and associated errors between the mask pattern and the developed mold geometry. Fluorescence is also produced in shadowed portions of the substrate, but this is generally unimportant due to the much lower primary doses.

RELATED ART

Early accounts of the LIGA process by Becker, et al. (see "Fabrication of Microstructures with High Aspect Ratios and Great Structural Heights By Synchrotron Radiation Lithography, Galvanoforming and plastic Moulding (LIGA Process)," *J. Microelectronic Eng.*, v.4, pp. 35-56, 1986) describe substrates consisting of thick steel or copper plates coated with gold, titanium or nickel. To improve adhesion, the surfaces of these substrates were roughened by microgrit blasting or wet oxidation. This early form of the process employed either PMMA sheets bonded to the substrate using cyanoacrylate glue or a PMMA resin that was cast directly onto the substrate surface. Based on present understanding, substrate technology evolved quickly toward the use of titanium disks or titanium films oxidized to produce significant surface roughness. This oxidized titanium provided good PMMA adhesion and a good surface for electrodeposition. Applied to glass or silicon wafers, titanium films further provided a sacrificial layer for the chemical release or partial release of parts at completion of the process. Variants of this titanium oxide substrate have been used widely and successfully ever since. Nevertheless, substrate technology has remained a topic significant research.

Guckel, et al. (see U.S. Pat. Nos. 5,190,637 and 5,378,583, herein incorporated by reference) also proposed a metallized glass or silicon wafer for use as a substrate. In this case, the silicon wafer was first roughened by surface oxidation and metallized with titanium and nickel to produce a conductive surface. The nickel surface served as a plating base, while the titanium film provided a sacrificial layer for removal of the metal parts. They further proposed bonding PMMA sheets to their substrate using a thin spin-cast layer of PMMA applied to the substrate surface. The PMMA sheet was then solvent-bonded to this layer using methyl methacrylate monomer. Finally, they suggested a substrate consisting of a silicon wafer metallized with titanium, copper and more titanium. Here the outer titanium layer was removed by etching to expose a copper base before electrodeposition, and the copper film served as a sacrificial layer for part release. This substrate has also been widely used, despite some rather severe limitations. The high X-ray cross-section of copper limits this substrate to use with very soft X-ray sources since harder sources require an excessive mask absorber thickness to avoid loss of adhesion. In addition, this substrate always requires a post-development etch to remove insoluble PMMA adjacent to the substrate, owing again to the large cross-section of copper.

Recognizing the importance of secondary radiation, several investigators have since addressed the effects of the X-ray spectrum and substrate materials on PMMA adhesion. Using theoretical and experimental means, Pantenburg, et al. (see "Adhesion Problems in Deep-Etch X-ray Lithography Caused by Fluorescence Radiation from the Plating Base," *J. Microelectronic Eng.*, v.23, pp. 223-226, 1994; and "Characterization of Defects in Very High Deep-Etch X-Ray Lithography Microstructures," *Microsyst. Technol.*, v.4, pp. 89-93, 1998) demonstrated that doses in the resist adjacent to the substrate and the associated loss of adhesion depended on the X-ray critical energy when the substrate and absorber thickness are fixed and that adhesion can be improved significantly by increasing absorber thickness. Schmidt, et al. (see "Investigation of the Adhesive Strength of PMMA Structures on Substrates Obtained by Deep X-Ray Lithography," *J. Microelectronic. Eng.*, v.30, pp. 215-218, 1996) similarly demonstrated that interface doses depend on the substrate material for fixed absorber thickness and fixed X-ray energy. Here they investigated copper, titanium, vitreous carbon (hereinafter referred to as "VC") and gold substrates and showed that the post-exposure PMMA bond strength decreased dramatically with increasing atomic number of the substrate material. Under their conditions, the measured bond strength for the titanium substrate was about 65% of that for carbon; the strength for copper was about half that for titanium.

Only a few studies have also addressed the important issue of adhesion between the substrate and the electrodeposited metal. Kunz, et al. (see "Adhesion of Ni Structures on $Al_2O_3$ Ceramic Substrates used for the Sacrificial Layer Technique," *Microsyst. Technol.*, v.6, pp. 121-125, 2000) examined the adhesion of nickel-to-ceramic wafers metallized with layers of chrome and gold. They demonstrated that adsorbed water on the ceramic surface and the temperatures used for depositing their metal films played important roles in metal adhesion. El-Kholi, et al. (see "Alternate Resist Adhesion and Electroplating Layers for LIGA Process," *Microsyst. Technol.*, v.6, pp. 161-164, 2000) investigated both PMMA and metal adhesion for a silicon wafer coated with carbon or metallized with oxidized titanium. They showed superior adhesion of the PMMA for the carbon coating following X-ray exposure, though metal adhesion to the carbon for electrodeposited nickel, copper and gold were very poor. Metal adhesion was improved by patterning the carbon with small platinum dots prior to bonding the PMMA resist. This patterned platinum slightly degraded PMMA adhesion. Finally, Makarova, et al. (see "Microfabrication of Freestanding Metal Structures using Graphite Substrate," *Sens. Actuators A*, v.103, pp. 182-186, 2003) successfully demonstrated use of a monolithic graphite substrate in producing tall copper structures. Both PMMA and SU-8 were used as the X-ray resist. They attributed the good performance of this substrate to the low X-ray cross-section of carbon and the micro-porous roughness of the graphitic carbon surface.

SUMMARY OF THE INVENTION

Critical to the preparation of LIGA parts, therefore, is the use of an X-ray mask which provides straight feature walls and a thick absorber layer in order to provide good image resolution and contrast. The mask should also provide a substrate that as low an X-ray cross section as possible and a low fluorescence yield to avoid dimensional errors and degradation of resist bond strength.

It is an object of this disclosure, therefore, to describe an embodiment of an lithographic mask for use in X-ray lithography especially with LIGA.

It is yet another object of this invention to provide a method for making an X-ray capable of providing high resolution features in a PMMA resist when exposed to X-rays.

It is another object of this disclosure to describe a substrate having as low an X-ray cross-section as possible while also providing good electrical conductivity.

Yet another object is to provide a substrate having a surface for ready nucleation of electrodeposits.

Still another object is to provide a substrate that exhibits a low fluorescence yield under X-ray exposure.

These and other objects, advantages and features of the invention will become apparent to those having skill in the art after a reading of the following description of the various embodiments when considered with the appended claims and drawings.

DETAILED DESCRIPTION OF THE EMBODIMENTS

In an effort to reduce X-ray absorption in the mask substrate, a substrate with low atomic number (hereinafter referred to as a "low Z" material) is preferred. Low Z materials commonly used as substrate sheets are beryllium and graphite. In addition, aluminum has been described as a useful substrate material for providing a LIGA mold.

Each of these materials is, however, problematic. Beryllium is toxic, expensive, and exhibits poor surface adhesion characteristics for typical absorber materials. Graphite is porous, which leads to problems in applying a suitable resist and to problems with increased roughness in the sidewalls of the exposed/developed resist which we believe is due to small angle X-ray scattering and uneven dose deposition caused by the porosity and crystallinity of the graphite. Lastly, because aluminum has more than twice the atomic number of either beryllium or graphite, its use as an X-ray mask is limited due to its high X-ray cross-section, i.e., an aluminum sheet in thicknesses greater than about 100 μm (necessary for mechanical stability in large diameter substrate) absorbs too much of the incident X-ray flux to be useful.

Notwithstanding the shortcomings of graphitic carbon, a material thought to be potentially useful as a low-Z mask substrate is vitreous carbon, (hereinafter referred to as "VC") (see Scheunemann, H.-U., et al., "Cost Effective Masks for Deep X-ray Lithography," *Proc. SPIE, Smart Sensors, Actuators and MEMS,* 2003. v. 5116: pp. 775-781).

Unfortunately, no one has yet proposed a method for overcoming the poor nucleation and adhesion problems associated with electrodepositing, or otherwise forming, a metal absorber layer onto a VC substrate.

This application, therefore, describes methods for overcoming this limitation and for providing a method for preparing an X-ray mask having a VC substrate onto which an electrodeposit can be effectively initiated and which also exhibits sufficient metal adhesion to allow it to support the metal layer. The approach is also suitable for providing molds for the LIGA process.

It is known that absorption of X-rays in the mask substrate can lead to heating and thermal distortion during deep and ultra deep X-ray lithography exposures. In addition, X-ray absorption in the mask can significantly increase required exposure times and harden the X-ray spectrum necessitating the use of a thick absorber layer in order to achieve sufficient image contrast. Unfortunately, fabricating X-ray masks having thick absorber layers while also achieving desired resolution in the replicated image has been difficult.

Figure 3:
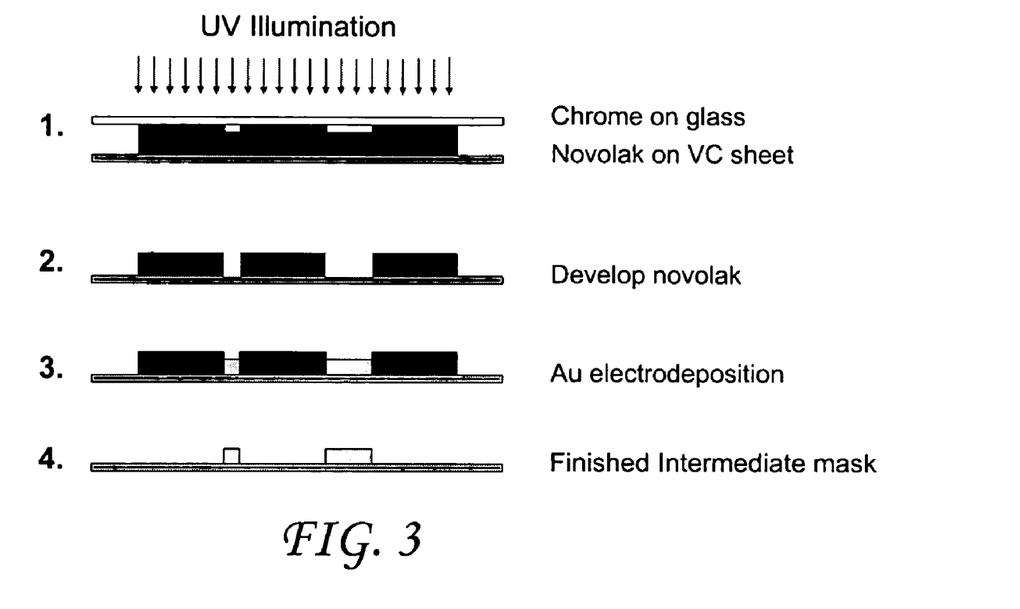
FIG. 3 shows the principle steps necessary to manufacture a thin, intermediate ("transfer") mask using UV light lithography.

To achieve the objects of the invention, the Applicants teach a two-step process for preparing an X-ray mask with a thick absorber layer. The first step of the process uses UV lithography to prepare an intermediate, or "transfer," mask having a thin metal absorber layer mounted on a VC substrate. FIG. 3 shows the principle steps for providing such a mask. As shown, the VC substrate is coated with a suitable UV photoresist such as novolac, exposed to a source of UV light patterned by a standard transfer mask, developed to remove exposed or unexposed portions of the resist depending on the resist chemistry selected, coated with an X-ray absorber material, and finally cleaned to remove the remaining resist.

Figure 4:
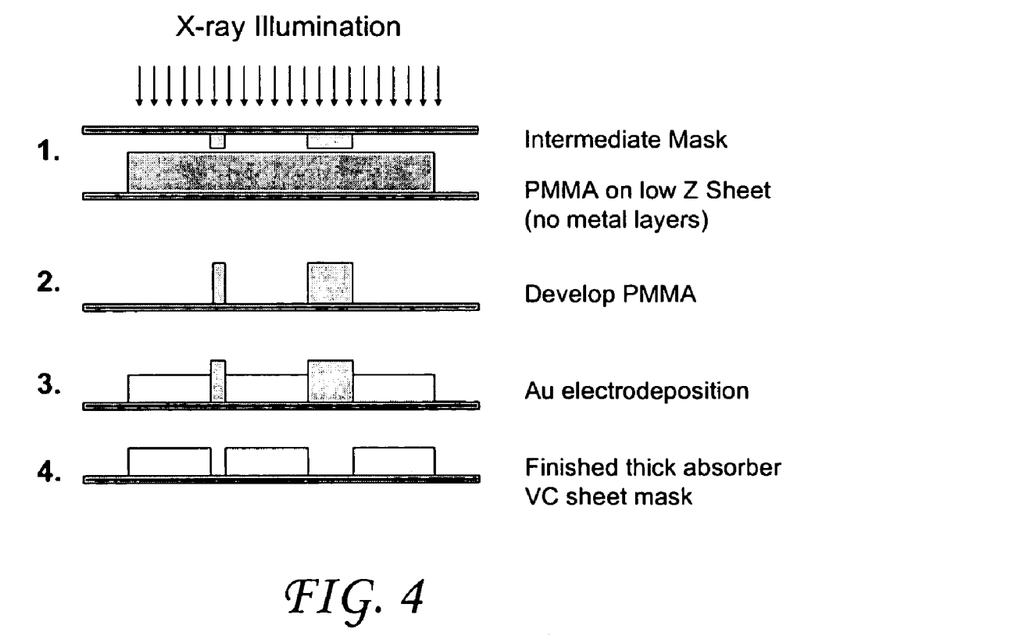
FIG. 4 shows the principle steps necessary to manufacture a thick X-ray mask using X-ray lithography and the thin transfer mask of FIG. 3. Note that the VC sheet used as the substrate for the thick mask has no additional higher Z materials added.

The second step in the process uses this intermediate mask in an X-ray lithography copy step to prepare the final X-ray mask. As shown in FIG. 4 a source of X-ray radiation is used to illuminate the intermediate transfer mask creating an image of the mask pattern on a thick photoresist such as PMMA or SU-8, mounted onto a second VC substrate. (Note that no metal adhesion layers are added to the second VC substrate at this stage.) The photoresist on the final X-ray mask is then developed to remove exposed or unexposed portions of the resist depending on the resist chemistry selected, coated with an X-ray absorber material, and cleaned to remove the remaining resist.

Preparing Unfinished Vitreous Carbon Blanks

VC blanks were obtained from Atomergic Chemetals Corporation (Farmingdale, N.Y.) and Goodfellow Corporation (Berwyn, Pa.). As received from the manufacturers, the VC blanks exhibited a surface topography that deviated from a flat surface by over about 100 μm. Surface roughness, however, was found to deviate by only tens of nanometers, RMS, although there remain some small protruding imperfections that were several micrometers tall.

While the "as-received" material exhibits good flexural strength (manufacturer reports a nominal 210 MPa flexure strength), we found that it was difficult to machine blanks having thicknesses of 1 mm or less. To overcome this we bonded the VC blank to a thicker (2 mm) flat borosilicate glass wafer using a synthetic wax (e.g., Crystalbond®) that is easily applied and removed by applying heat over 55° C. After this rigid mounting, the material was planarized using several steps of diamond slurry lapping/polishing. Our yield at this stage exceeded 80%.

Vitreous Carbon Surface Modification

Preliminary tests have been conducted and confirm that direct electrodeposition to a VC surface, both in nucleation and adhesion, would be difficult. We found, however, that by physically modifying the surface of the VC substrate these difficulties could be largely mitigated.

Figure 5:
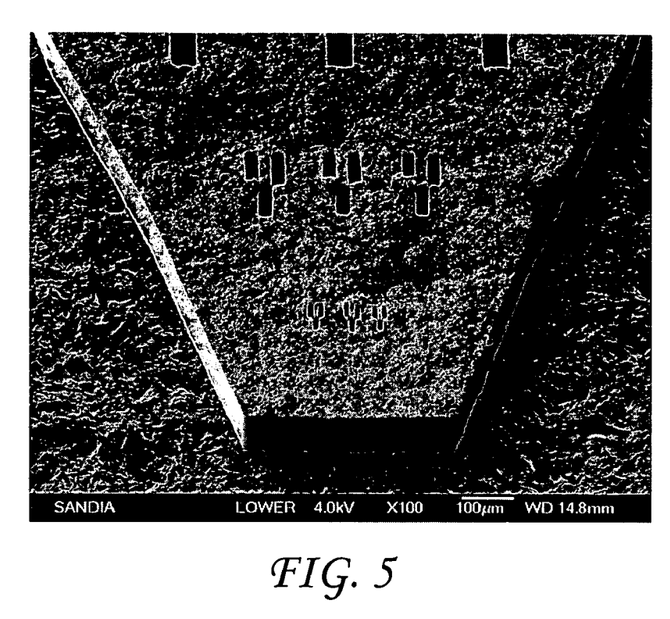
FIG. 5 shows a 100 µm thick gold absorber layer patterned with X-ray lithography on a VC sheet with no metallization layers after media blasting the surface, wherein the smallest feature size is 10 µm across.

A first approach was to physically roughen the material by a pneumatic media blasting process using a 70-140 μm glass beads. This method works well to enable good nucleation. The method, however, is limited to structure having a discrete minimum feature size because the adhesion of the metal structures to the VC substrate is itself limited, likely because the roughness provided by the media blasting process is limited at the micrometer scale. That is, at smaller and smaller scales the roughened surface behaves as if it were smooth. Our tests show that this method is confined to use where minimum feature sizes of free-standing features are 50 μm and above. FIG. 5 shows a mask test slip fabricated based on this method.

For applications where structures include features smaller than 50 μm we have found that a reactive ion etching process, using an oxygen plasma, creates a surface that enhances resist adhesion and subsequent metal nucleation and metal adhesion. For example, a 4" wafer was etched in an inductively coupled plasma reactive ion etch tool (Oxford Plasmalab 100 380ICP obtained from AMO GmbH, Aachen, Germany), at a DC bias of about 400 Volts for a duration of about 2 hours, at a chamber pressure of about 100 mTorr, and an oxygen inlet stream of about 50 SCCM.

Figure 6:
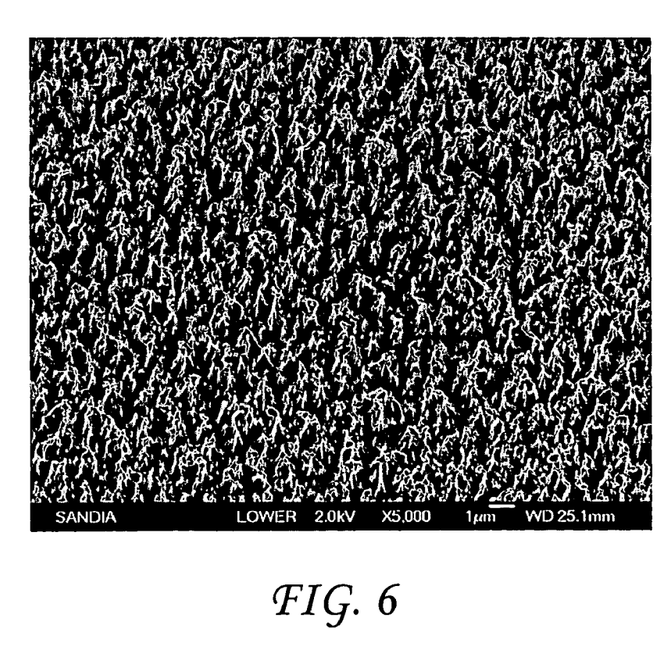
FIG. 6 shows a VC surface after having been etched with an oxygen plasma. Sub-micrometer column-like structures significantly increase adhesion of both the X-ray resist and the metal absorber layer, without the necessity of adding higher Z materials.

FIG. 6 shows a VC surface prepared with an oxygen plasma etch. The column-like structures which result from the etching procedure are believed to enhance metal adhesion by increasing the available surface area for the metal deposit to adhere and by providing an opportunity for the deposited metal to mechanically interlock with these structures as the deposit is laid down. The same is true for adhesion of the photoresist.

Preparing the X-Ray Mask Via UV Lithography

The X-ray mask was prepared as described above by first preparing an intermediate transfer mask. A VC substrate wafer was first cleaned with an acetone/isopropanol/deionized water rinse followed by a brief 60 second nitrogen plasma cleaning (non-etching) step. This latter step is used to remove any remaining organic residue but does not etch the surface, i.e., the VC surface remains smooth and "mirror-like." The clean wafer was then coated with metal adhesion-promoting layers deposited onto the entire surface of the nascent mask. These are thin metal starting layers, or so-called "strike" layers, and are typically deposited by sputtering or particle vapor deposition over the entire surface of the mask and are provided in order to promote adhesion and to provide a surface for nucleation of a thicker metal layer. In the present example, the deposited "strike" layer was formed by a sputter deposited 6 nm of chromium layer followed by a 30 nm of gold layer. The use of the adhesion promoting layers is acceptable at this stage since X-rays are not used in its fabrication to fabricate of the intermediate mask and there are, therefore, no secondary radiation issues involved at this stage in the process.

After providing the metal strike coating, the wafer was then spin-coated with a novolac positive tone photoresist (Shipley AZ9260) and the photoresist was dried and cured. The cured photoresist surface was then illuminated with a UV light source in a Karl Suss MA6 mask aligner operating at a wavelength of 365 nm (I line) imaged through a chromium-on-glass mask (suitable for UV lithography but not for X-ray lithography). The photoresist was then developed using standard development materials and techniques to provide the image of the glass mask thereby exposing portions of the metal strike layer previously applied. The developed surface was then cleaned, and dried and about 2-10 µm of gold was electrodeposited onto the "strike" layer as an absorber layer. At this point the mask can be used directly as a primary X-ray mask, if a thicker gold absorber layer is applied, or as an intermediate mask to fabricate a thick absorber mask via X-ray lithography. The mask was completed by removing the remaining resist material from the surface of the VC wafer.

At this stage there is provided an intermediate transfer mask suitable for use in imaging an X-ray source onto an X-ray resist such as PMMA and thereby providing the desired final X-ray mask. To provide the X-ray mask a second VC wafer was provided and cleaned as described above. Additionally, a surface of the cleaned wafer was etched using the oxygen plasma etching process also described above. FIG. 6 shows a VC surface prepared with an oxygen plasma etch. The column-like structures which result from the etching procedure are believed to enhance metal adhesion by increasing the available surface area for the metal deposit to adhere and by providing an opportunity for the deposited metal to mechanically interlock with these structures as the deposit is laid down.

After etching the PMMA photoresist was bonded to the etched surface of the VC wafer. An annealed PMMA sheet was bonded to the VC wafer using either solvent or a PMMA-based glue developed at Forschungszentrum Karlsruhe (FZK). For solvent bonding, a 2 µm layer of PMMA (950 kg/mol) was first applied to the substrate by spin casting. The PMMA sheet was then bonded to the cured spin layer using methyl methacrylate ("MMA") monomer. For gluing, the adhesive consisted of 10 g of 15% by weight PMMA in MMA, 0.1 g of N,N-dimethyl aniline, 0.1 g of 3-(trimethoxysilyl)propyl methacrylate ("MEMO"), and 0.1 g pf benzoyl peroxide. This was degassed under a rough vacuum of 22 mmHg for a few minutes before application, and the bond interface was loaded to 450 kPa (65 psi) with a press and glass platens for a minimum of four hours. Note that there are no metal adhesion layers added to the second VC substrate surface at this stage.

After bonding, the PMMA sheet was exposed to a source of X-ray radiation imaged through the intermediate mask prepared in the first step of this procedure in a lithographic copy step to prepare the final X-ray mask, again as is shown in FIG. 4. X-ray exposure was performed using the Lawrence Berkeley National Laboratory Advanced Light Source operating at 1.9 GeV and filtered with aluminum. The calculated primary dose at the bottom of the PMMA was to be 3.2 kJ/cm$^3$. Those parts of the PMMA photoresist which were exposed to the X-ray source were then developed and removed. A G-G developer (60 vol % 2-(2-butoxy-ethoxy) ethanol; 20 vol % tetra-hydro-1,4-oxazine (Morpholine); 5 vol % 2-amino-ethanol-1 (Ethanolamine); and 15 vol % water) was allowed to contact the exposed photoresist for about 3 hours at room temperature. After development the nascent X-ray mask was washed thoroughly with G-G rinse and subsequently rinsed with deionized water and dried.

Following development the cleaned X-ray mask was coated with metal adhesion-promoting layer in those areas exposed to the surface of the VC wafer. This adhesion-promoting layer is another so-called "strike" layer but is this time deposited electrochemically so that it only coats the exposed portions of the VC wafer. The layer also provides a surface for nucleation of a thicker electrodeposited metal absorber layer. In the present example, the deposited "strike" layer was formed by depositing about 6 µm of copper on the exposed areas of the VC surface. This is followed by electrodepositing a thick absorber layer comprising about 50 µm of gold onto the "strike" layer. The fabrication of the X-ray mask is then completed by dissolving the remaining (unexposed) PMMA photoresist material from the surface of the VC wafer. Acetone was used for this step since it is a fairly mild solvent; however, other common solvents which could be used for this purpose are any of n-hexane, n-heptane, cyclohexane, benzene, toluene, ethyl benzene, styrene, ethyl ether, trichloromethane, tetrahydrofuran and ethyl acetate.

It was found that the "strike" adhesion-promoting layers led to good nucleation and very good adhesion of the gold absorber layer, even after repeated use of the masks for exposures. Adhesion was measured by using a 90° tape peel test in which the pulling force was measured. Lapped vitreous carbon disks showed poor metal adhesion. However, VC disks processed using the oxygen plasma preparation followed by a copper strike plating were seen to provide very good adhesion.

Figure 7A:
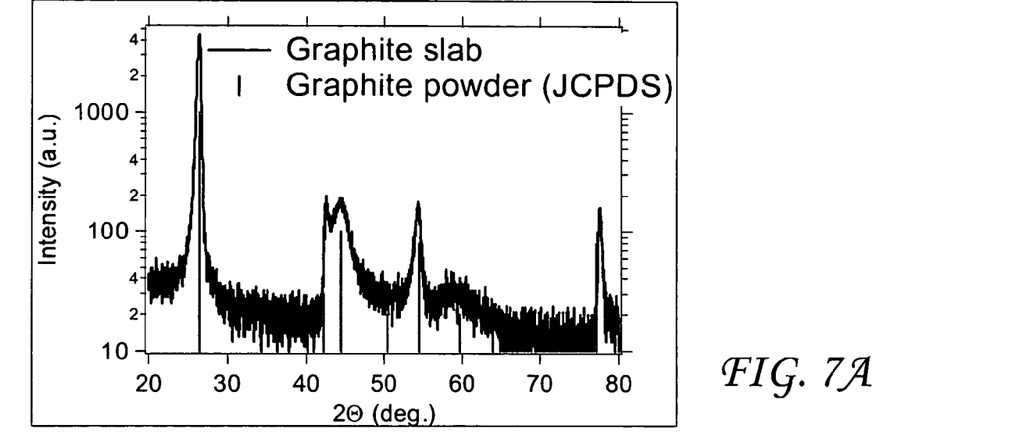
FIGS. 7A and 7B show a comparison of X-ray diffraction between graphite and VC wherein VC (top graph) is seen as nearly amorphous, while graphite (bottom graph) shows strong crystallinity.
Figure 7B:
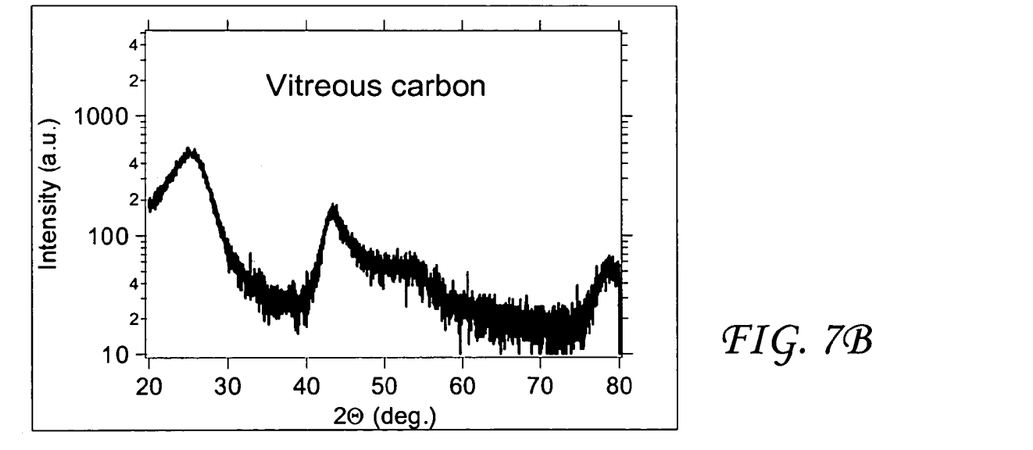
Figure 8:
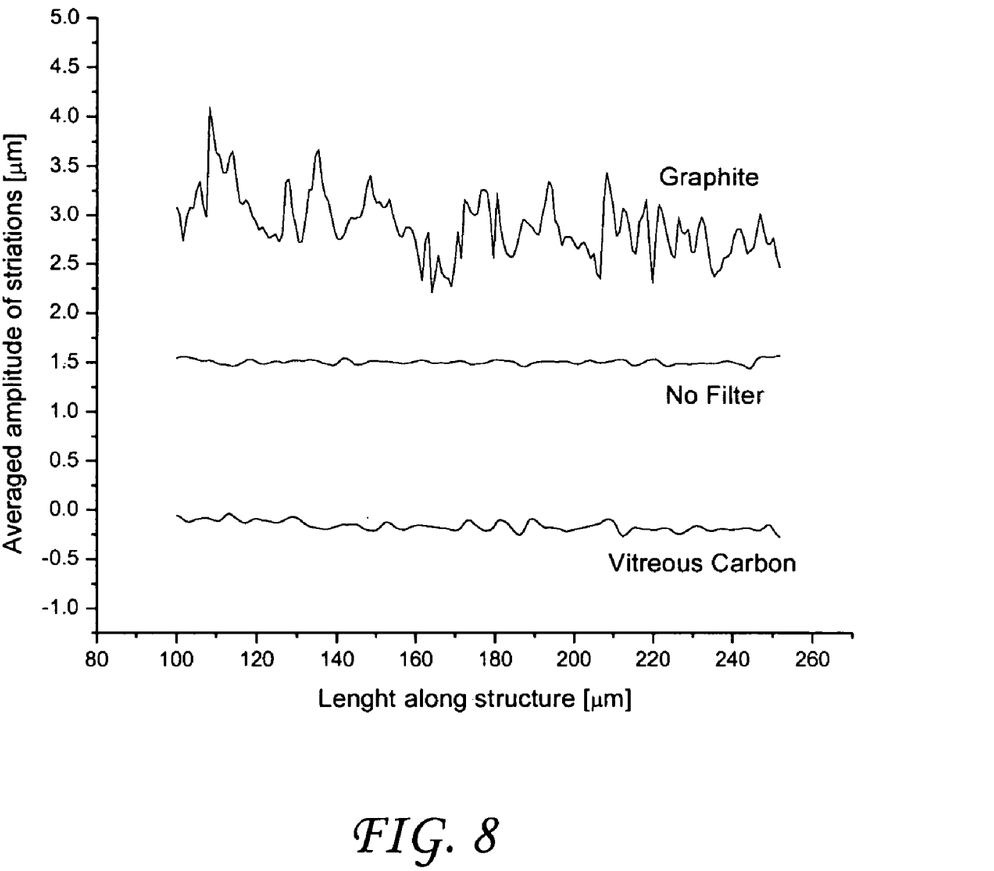
FIG. 8 shows the difference in surface roughness (striations) of exposed resist, when introducing a filter between a high fidelity mask and the X-ray resist. Unlike graphite, VC as a mask substrate introduces no additional roughness in the exposed resist.
Figure 9:
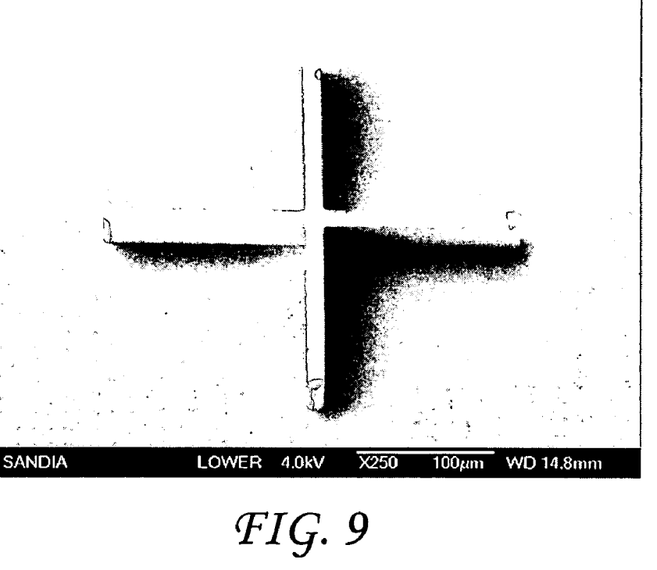
FIG. 9 shows a photomicrograph of a positive absorber layer structure, patterned with UV lithography, having a nominal linewidth of 10 μm in the shape of a cross, on a VC substrate.
Figure 10:
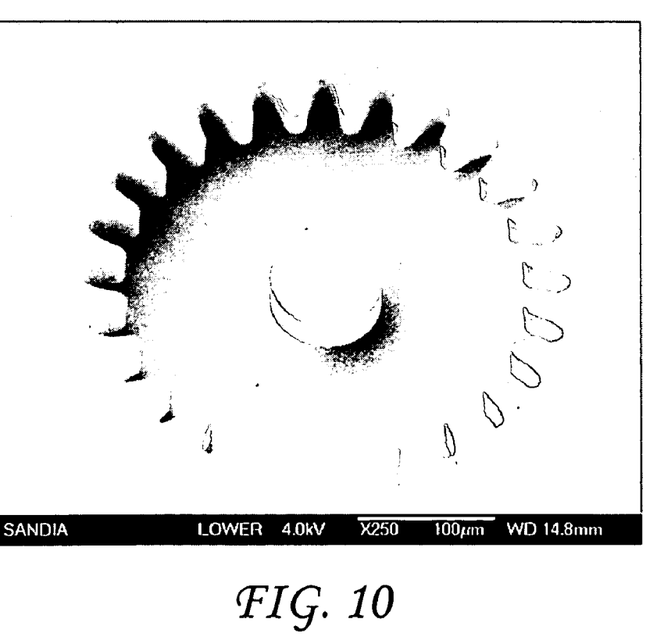
FIG. 10 shows a negative absorber structure for a mechanical gear, patterned with UV lithography, on a VC substrate.
Figure 11:
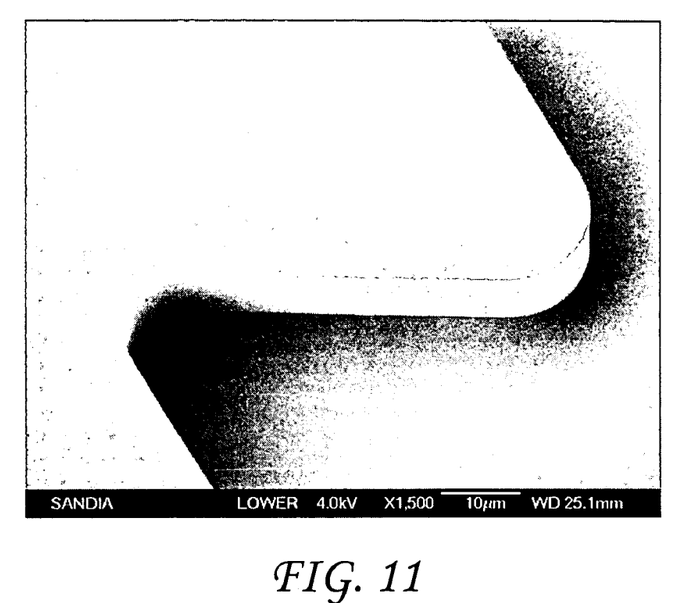
FIG. 11 shows a pawl arm tip for a mechanical mechanism, patterned with UV lithography, and using a gold absorber layer on a VC substrate.
Figure 12:
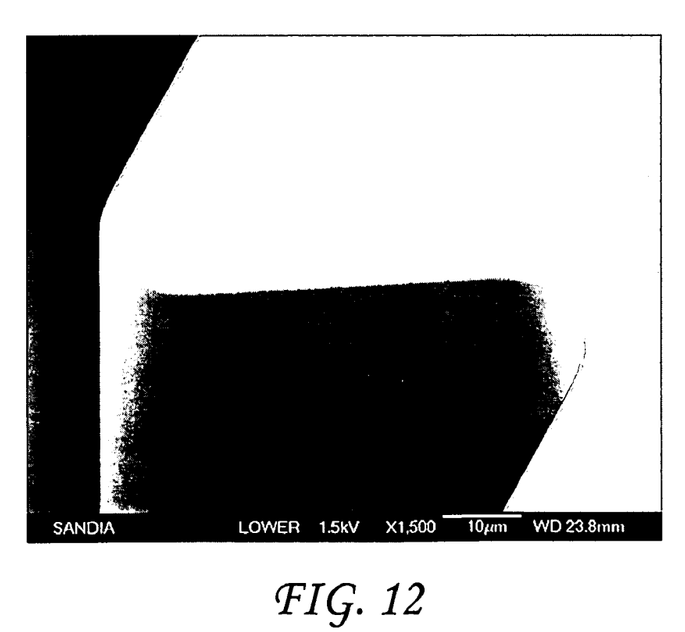
FIG. 12 shows a portion of a PMMA resist mold after exposure and development using the mask shown in FIG. 9.

FIGS. 9-12 illustrate features of various embodiments using a VC substrate. In particular, FIGS. 9-11 shows details of a prototype mask and FIG. 12 shows the LIGA mold fabricated using that mask. Sidewalls of the mask and mold are seen as smooth and features well defined. We also found that vitreous carbon overcomes the problem of side-wall striations. X-ray diffraction measurements, shown in FIGS. 7A and 7B, confirm that the material is nearly amorphous. Moreover, FIG. 8 shows the results of exposure tests using graphite and vitreous carbon substrates and provides quantitative evidence that vitreous carbon does not significantly added to sidewall surface roughness and is, therefore, far superior to graphite.

Finally, to the extent necessary to understand or complete the disclosure of the present invention, all publications, patents, and patent applications mentioned herein are expressly incorporated by reference therein to the same extent as though each were individually so incorporated.

Having thus described exemplary embodiments of the present invention, it should be noted, by those skilled in the art, that the foregoing disclosure is exemplary only and that various other alternatives, adaptations, and modifications may be made within the scope of the present invention. Accordingly, the present invention is not limited to the specific embodiments as illustrated herein, but is only limited by the following claims.

What is claimed is:

1. A lithographic mask comprising a vitreous carbon substrate, wherein a surface of the vitreous carbon substrate comprises a microscopically roughened surface and a patterned metal X-ray absorber layer adhering to the microscopically roughened surface.

2. The lithographic mask of claim 1, wherein the metal absorber layer comprises a metal strike layer.

3. The lithographic mask of claim 1, wherein the metal absorber layer may comprise one or more layers comprising the same or different metals.

4. The lithographic mask of claim 2, wherein the metal absorber layer is deposited by a process selected from the list consisting of electrodeposition, sputtering, particle vapor deposition, and combinations thereof.

5. The lithographic mask of claim 2, wherein the metal absorber layer is deposited over the metal strike layer.

6. The lithographic mask of claim 1, wherein the metal absorber layer is gold.

7. The lithographic mask of claim 2, wherein the metal strike layer is selected from the list consisting of chromium, copper, gold and combinations thereof.

8. The lithographic mask of claim 1, wherein the metal absorber layer is about 10 microns thick.

9. A lithographic mask comprising a vitreous carbon substrate, wherein a surface of the vitreous carbon substrate is etched in a reactive ion oxygen plasma to provide a microscopically roughened surface, and wherein an X-ray resist material is affixed to the microscopically roughened surface.

10. The lithographic mask of claim 9, wherein the X-ray resist material comprises a polymer.

11. The lithographic mask of claim 10, wherein the polymer is selected from the list consisting of PMMA and SU-8.

12. The lithographic mask of claim 9, wherein the resist is affixed to the substrate by casting a polymer resin onto the surface of the substrate and curing the resin to produce a suitable resist layer.

13. The lithographic mask of claim 10, wherein the X-ray resist material comprises a sheet.

14. The lithographic mask of claim 13, wherein the sheet is affixed to the substrate by gluing the sheet to the surface of the substrate with a suitable adhesive.

15. The lithographic mask of claim 13, wherein the sheet is affixed to the substrate by applying a thin spin-cast layer to the surface of the substrate and subsequently solvent bonding the sheet to the spin-cast layer.

16. The lithographic mask of claim 9, wherein the X-ray resist material is exposed to a source of patterned X-ray radiation for a period of time, and wherein the exposed resist material is developed to remove portions of the resist material, thereby providing a plurality of areas open to the microscopically roughened surface.

17. The lithographic mask of claim 16, wherein the open areas of the microscopically roughened surface are coated with a thin metal coating.

18. The lithographic mask of claim 17, wherein the thin metal coating comprises one or more layers comprising the same or different metals.

19. The lithographic mask of claim 18, wherein the thin metal coating is selected from the list consisting of chromium, nickel, copper, gold and combinations thereof.

20. The lithographic mask of claim 19, wherein the thin metal coating is provided by a process selected from the list consisting of electrodeposition, sputtering, particle vapor deposition, and combinations thereof.

21. The lithographic mask of claim 17, wherein the plurality of areas are filled with a thick metal layer deposited onto the thin metal coating.

22. The lithographic mask of claim 21, wherein the thick metal layer is gold.

23. A method for preparing a microfabricated device, comprising the steps of:

providing a lithographic mask comprising a vitreous carbon substrate, wherein a surface of the vitreous carbon substrate is etched in a reactive ion oxygen plasma to provide a microscopically roughened surface, and wherein an X-ray resist material is affixed to the microscopically roughened surface;

exposing the lithographic mask to X-ray radiation through a patterned mask;

developing the exposed substrate to remove portions of the resist, thereby providing a plurality of areas open to the microscopically roughened surface of the vitreous carbon substrate; and filling the plurality of areas open to the surface of the vitreous carbon substrate with a metal deposit.

24. The method of claim 23, wherein the step of filling further includes a preliminary step of coating the plurality of areas open to the surface of the substrate with a thin metal coating.

25. The method of claim 24, wherein the step of filling comprises electrodepositing the metal deposit onto the thin metal coating.

* * * * *